United States Patent [19]

Brown et al.

[11] Patent Number: 5,780,359
[45] Date of Patent: Jul. 14, 1998

[54] POLYMER REMOVAL FROM TOP SURFACES AND SIDEWALLS OF A SEMICONDUCTOR WAFER

[75] Inventors: William Brown, San Jose; Harald Herchen, Fremont; Walter Merry, Santa Clara; Michael Welch, Livermore, all of Calif.

[73] Assignee: Applied Materials, Inc., Santa Clara, Calif.

[21] Appl. No.: 570,058

[22] Filed: Dec. 11, 1995

[51] Int. Cl.$^6$ ............................................. H01L 21/302
[52] U.S. Cl. ..................... 438/659; 134/1.2; 156/643.1
[58] Field of Search ..................... 216/70, 71; 134/1.2; 156/659.11, 643.1

[56] References Cited

U.S. PATENT DOCUMENTS

| | | | |
|---|---|---|---|
| 4,673,456 | 6/1987 | Spencer et al. | 156/643 |
| 4,875,989 | 10/1989 | Davis et al. | 156/345 |
| 4,980,022 | 12/1990 | Fujimura et al. | 156/643 |
| 5,382,316 | 1/1995 | Hills et al. | 156/643 |
| 5,432,315 | 7/1995 | Kaji et al. | 156/345 |

FOREIGN PATENT DOCUMENTS

| | | |
|---|---|---|
| 03236233 | 10/1991 | Japan . |
| 05102094 | 4/1993 | Japan . |

*Primary Examiner*—R. Bruce Breneman
*Assistant Examiner*—George Goudreau
*Attorney, Agent, or Firm*—Michael A. Glenn; Peter J. Sgarbossa

[57] ABSTRACT

A process for producing a strip removes photoresist and extraneous deposits of polymer residue on the top surface and sidewalls of a post-metal etch wafer. The photoresist and residue are processed simultaneously by a chemical mechanism comprising reactive species derived from a microwave-excited fluorine-containing downstream gas, and a physical mechanism comprising ion bombardment that results from a radio frequency excited plasma and accompanying wafer self bias. A vacuum pump draws stripped photoresist and residues from the surface of the wafer and exhausts them from the chamber.

12 Claims, 2 Drawing Sheets

5,780,359

POLYMER REMOVAL FROM TOP SURFACES AND SIDEWALLS OF A SEMICONDUCTOR WAFER

BACKGROUND OF THE INVENTION

1. Technical Field

The invention relates to integrated circuit processing. More particularly, the invention relates to the post etch processing of integrated circuits.

2. Description of the Prior Art

During the fabrication of an integrated circuit on a semiconductor wafer substrate, interconnections must be made among the various structures that comprise the circuit and to pads that allow the IC to be connected to external circuits and devices. The preferred method for forming these interconnections is through the use of a process, referred to as metallization, in which a conductive material, such as aluminum, is applied to the wafer. Such metallization typically uses a patterning technique that involves a photosensitive material (i.e. photoresist). The patterned surface of the wafer is developed to remove photoresist from those areas that are to be etched. The surface of the wafer is then etched to remove the exposed portion of the aluminum and thereby provide the appropriate connections. Thereafter, excess photoresist may be removed from the surface of the wafer.

Metal etch processes as are discussed above typically use a dry plasma etch technique. The dry plasma etch is anisotropic, i.e. it etches in a fashion that exhibits an accelerated etch rate perpendicular to the surface of the wafer. The gases most commonly used for the dry etch are $BCl_3$ and $Cl_2$. The use of radio frequency energy (RF) or microwave energy to excite the etch gas and thereby ignite a plasma that is used for the anisotropic dry etch process is well known in the prior art.

FIG. 1 is a cross section of a wafer 1 after metal etching. During different stages of the IC fabrication process, residues are generated by the material that is being etched, as well as by various chemical components of the etch gasses. These residues can include such materials as silicon byproducts, copper, chlorine, aluminum, and fluorine containing compounds. Additionally, the photoresist that is used to pattern the wafer surface remains on the wafer surface after the metal etch process is completed. Due to the small size and high density of the interconnections, photoresist and small amounts of contaminants remaining on the IC after the metal etch process can interfere with contact formation. It is therefore of critical importance to remove from the surface of the wafer all extraneous processing by-products, such as photoresist and polymers 4, 5 that are built-up on the sidewalls 2 and top surface 3 of the wafer. Unfortunately, these materials are extremely difficult to remove entirely without running the risk of damaging the delicate structures of the IC.

The metallic material that is etched primarily constitutes aluminum, but may also contain a percentage of silicon and copper. These silicon and copper impurities create troublesome compounds in the residues, thereby exacerbating the problem of their removal. Furthermore, because the photoresist is an organic polymer, it also contributes polymer-forming carbon-containing species to the residue.

The current methods of removing photoresist and residue typically involve the use of a downstream oxygen plasma that etches the residue from the surface of the wafer. It is thought that the atomic oxygen produced in the plasma is the primary active species for removing the polymer residue. Thereafter, it is usually desirable to passivate the wafer and thereby inhibit corrosion mechanisms that can damage the wafer.

It would be a significant advance in the art to provide an improved process for simultaneously removing photoresist and polymer residue from the top surface and sidewalls of a post-metal etch wafer. It would be a further advance in the art if such a process removed the photoresist and polymer residue while minimizing such problems as corrosion.

SUMMRRY OF THE INVENTION

The invention provides a process for removing photoresist and uneven depositions of polymer residues that are formed on the top surface and sidewalls of a post-metal etch wafer. Microwave or radio frequency energy is supplied to a remotely located gas stream that includes fluorine-containing species. Radio frequency energy is simultaneously supplied to the wafer chuck to self bias the wafer relative to the process chamber, while an increased pressure is maintained in the chamber. Thus, chemical strip mechanisms associated with the reactive species generated by the remote plasma are enhanced by the physical mechanisms of ion bombardment created by the application of RF power to the wafer chuck. A strip mechanism is thereby produced that simultaneously removes top surface and sidewall photoresist and polymer deposits from the surface of the wafer.

DETAILED DESCRIPTION OF THE INVENTION

Figure 2:
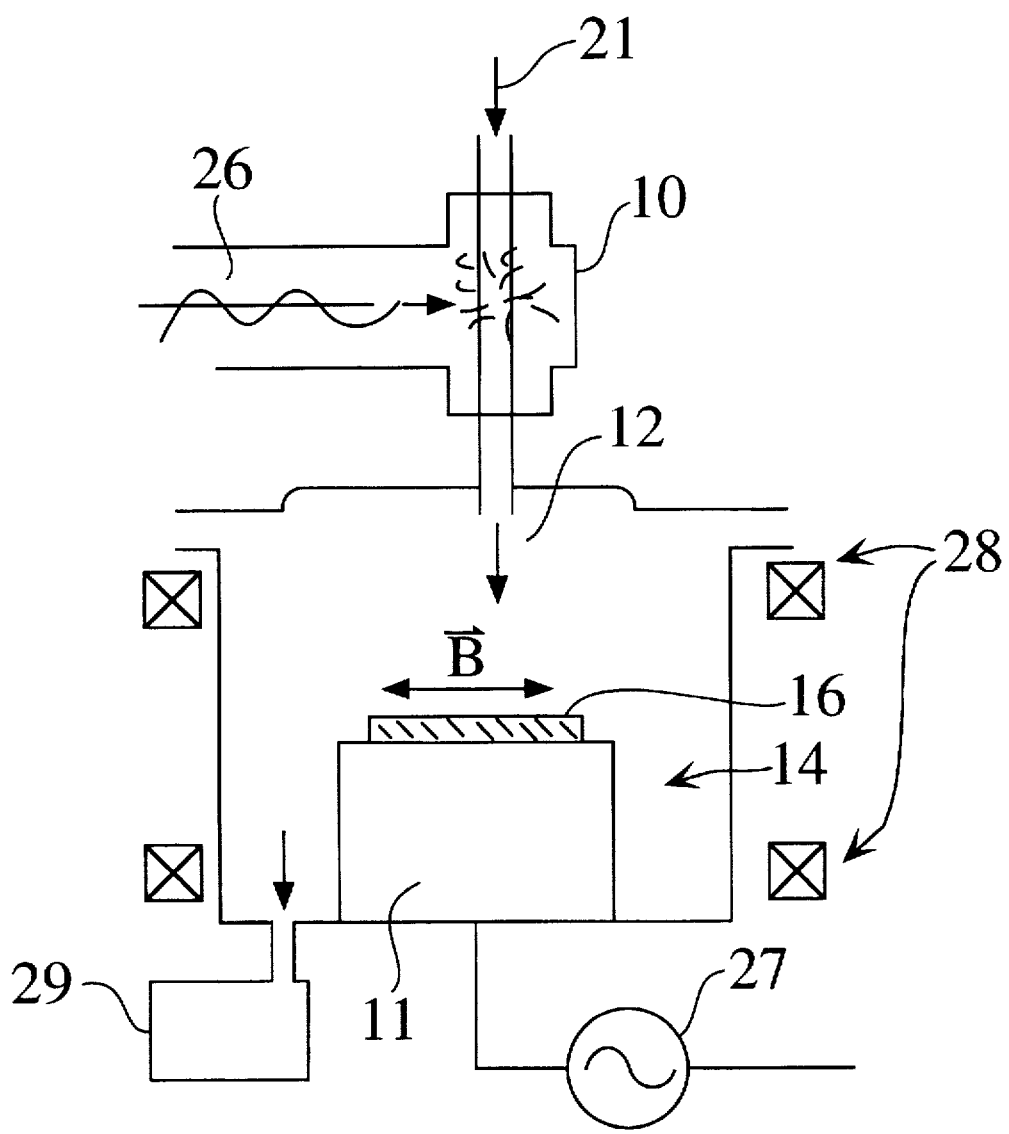
FIG. 2 is a side sectional view of a plasma etching apparatus according to the preferred embodiment of invention.

The invention provides a method for removing photoresist and extraneous deposits of polymer residue from the top and sidewall surfaces of a post-metal etch semiconductor wafer. FIG. 2 is a side sectional view of a process chamber 14 that includes a remote plasma generator 10 according to a preferred embodiment of the Invention. During wafer processing, for example during metal etching, an integrated circuit wafer 16 is positioned on a wafer chuck 11 in the process chamber 14. In the preferred embodiment of the invention, microwave energy 26 is applied to a process gas 21 in the remote plasma generator 14 upstream from the process chamber to form a plasma.

The active species generated by the remote plasma are injected into the chamber through a port 12, thereby promoting a strip of the photoresist and extraneous deposits from the semiconductor wafer. It is thought that small amounts of fluorine-containing species first break chemical bonds within the polymer residue at the microscopic level in a precursor reaction. The polymer residue is thus rendered more active towards attack and volatilization by the oxygen. In alternate embodiments of the process of the invention, these active species include fluorine-containing gases, such as $CF_4$, $SF_6$ and $NF_3$. Such additional active species are thought to be effective, for example in removing the silicon component of the residue from the sidewalls of structures formed on the wafer.

In an alternate embodiment of the invention, radio frequency energy is applied upstream from the wafer to form the downstream plasma. In this embodiment of the invention, a capacitive discharge or an inductive coil are provided as are known in the art. One important advantage in using microwave energy upstream from the chamber rather than using RF energy is that it is thought the distribution of species produced in a microwave plasma versus an RF plasma are different. Atomic species produced in a plasma excited with microwave energy are chemically the most active towards promoting the stripping process described herein. In a plasma excited with RF energy, more ionic species tend to be produced, rather than atomic species. In a microwave plasma there is a much greater enrichment in the effluent gasses of the atomic species as compared to ionic species. Therefore, the microwave plasma contains greater amounts of species, such as atomic oxygen or atomic fluorine, rather than ions such as $O_2^+, F_2^+$, or $F^+$.

Once the reactive species are Introduced into the process chamber (or, alternatively, as they are introduced therein), radio frequency energy (RF) is applied to the wafer chuck, causing the wafer chuck to function as a cathode. The RF energy strikes a plasma in the chamber and around the wafer. The polymer residues situated on the sidewalls and top surface of the post-metal etch wafer are thus not only chemically stripped with the microwave-excited downstream gas, but are also subjected to ion bombardment as a result of RF induced wafer self bias.

This plasma is of sufficient intensity to develop self-bias on the cathode and thereby strip photoresist and extraneous residues from the wafer surface. This process is thus best thought of as an isotropic chemical strip that is augmented by the RF power applied to the wafer. Thus the strip uniformly attacks, and substantially removes, the photoresist and polymer residue from the top surface and the sidewalls of the post-metal etch wafer.

In the process described herein, the RF energy is transmitted at the standard frequency of 13.56 MHz, as generated by an RF generator 27. In alternate embodiments of the invention, the RF frequency is varied according to the requirements of the process chamber manufacturer. The power levels of the applied RF energy are approximately in the few hundred watt range. Typically, electromagnets 28 are also provided to enhance the generation of etchant species within the plasma. In the preferred embodiment of the invention, a magnetic field is applied to the process chamber by such expedients as electromagnets 28 at the same time that the wafer/cathode is excited with the RF energy. The application of the magnetic field increases the path lengths of electrons and sustains their discharge at lower pressures without the need of applying additional RF power to the process. Thus, a lower intensity plasma may be used to effect residue stripping. The magnetic field is preferably applied using two pairs of coils whose axes are arranged at 90° to each other. Time varying currents are applied to the two sets of magnets to achieve a magnetic field in the chamber that rotates slowly in the horizontal plane.

Figure 1:
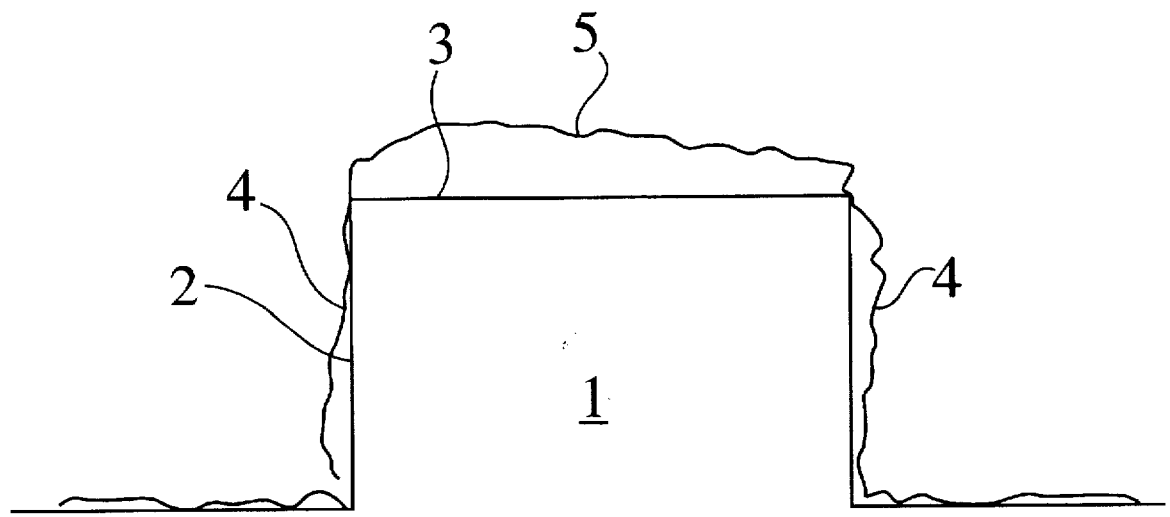
FIG. 1 is a cross section of a wafer showing photoresist and process residues deposited on the top surface and sidewalls thereof.
Figure 3:
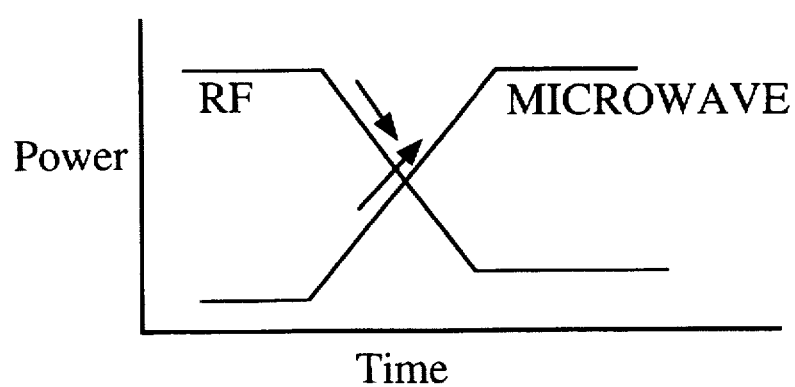
FIG. 3 is a graph plotting respective RF and microwave energy levels in watts vs. time in an exemplary embodiment of the invention.

In alternate embodiments of the invention, the RF source is modulated. The relative proportions of microwave and RF energy applied at different stages during the strip process may be ramped or varied to generate different chemical species or different strip characteristics at the earlier stage of the strip process versus later stages thereof. In this way, the degree of ion bombardment may commence with greater intensity when the polymer residue is thickest, and may be tapered off in intensity to avoid the possibility of damaging the wafer surface when the polymer residue is nearly removed from the wafer surface. FIG. 3 is a graph plotting respective RF and microwave energy levels in watts vs. time in an exemplary embodiment of the invention.

By using the excitation of gases upstream from the wafer in conjunction with the application of RF energy, it is possible to sustain an RF plasma in the chamber at lower power levels than without microwave excitation in the feed gases. This lower power level plasma avoids excessive ion bombardment of the wafer, and thereby avoids the associated plasma damage to delicate structures formed on the wafer surface. Thus, the process herein may be thought of as a method of producing a softer plasma by stimulating a process gas to produce reactive species before the gas in introduced into the process chamber and before the plasma is struck.

The pressure in the process chamber for the strip process is preferably elevated relative to the pressures used in an anisotropic etch process. Decreasing the pressure increases self bias of the wafer and the degree of ion bombardment.

In the process herein described, the pressure in the process chamber is approximately a few hundred millitor range, rather than the under one hundred millitor range that is used for anisotropic etching. At higher pressures, the degree of isotropic chemical strip is greater than that of anisotropic etch. Pressure within the process chamber is maintained by known techniques, such as the use of a roots blower 29.

In alternate embodiments of the invention, the isotropic strip process temperature may be varied from 20 degrees to over 100 degrees Celsius. The benefits of using lower temperatures include more precise temperature control (e.g. elimination of a the need for a heat lamp), while the benefits of using higher temperatures include a rate increase in the chemical portion of the strip process. The strip processing time is typically less than 2 minutes per wafer.

Water is another important additive species that is used for metal etch processes. In the process herein described, water is provided to the process chamber after it is vaporized, by delivery into the feed gas stream 21 at a lowenough and controlled flow rate that avoids saturation of the gas stream. The gas flow rate in the preferred embodiment of the invention is approximately 10 to 500 sccm, and the water flow rate approximately 5 to 50 sccm. It is thought that during wafer processing, the water is useful during passivation of the metal layer on the wafer surface to prevent corrosion thereof.

It is preferred that the flow of feed gas is started first and then stabilized. The chamber pressure, which is typically servo controlled, is subsequently stabilized. A plasma is then struck in the applicator by application of microwave energy thereto, the magnets are energized, and RF energy is applied is applied to the process chamber (as described above).

The photoresist and polymer residues are loosened as they are stripped from the surfaces of the wafer. The roots blower 29 also acts as an exhaust that effectively draws these residues from the wafer and out of the chamber, thereby preventing contamination of the wafer by particles generated from the polymer residues during the strip process.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. In a process chamber, a process for stripping photoresist and polymer residues from top surfaces and side walls of a post-metal etch semiconductor wafer, comprising the steps of:

initiating a flow of feed gas comprising fluorine-containing gases upstream from said process chamber;

applying to said feed gas means for producing a plasma;

supplying effluents of said plasma in the form of reactive species separated from said plasma to said process chamber;

applying radio frequency energy to said wafer in said process chamber to generate a lower intensity plasma therein and accompanying wafer self-biasing;

applying a magnetic field that rotates slowly in the horizontal plane to said process chamber during said step of applying radio frequency energy to said wafer to enhance plasma generation; and stripping said photoresist and polymer residues from the top surfaces and side walls of said post metal-etch wafer with said reactive species and said lower intensity plasma wherein the pressure in said process chamber is greater than 100 miliTorr.

2. The process of claim 1, wherein said plasma producing means is either of microwave energy and radio frequency energy.

3. The process of claim 1, wherein said fluorine-containing gases are either of $CF_4$, and $SF_6$.

4. The process of claim 1, wherein said radio frequency energy is generated at a frequency of 13.56 MHz.

5. The process of claim 4, wherein said radio frequency energy is modulated.

6. The process of claim 1, further comprising the steps of:

vaporizing water;

delivering said vaporized water into said feed gas at a controlled flow rate that is low enough to avoid saturation of said feed gas thereby; and forming a passivation layer on said post-metal etch wafer.

7. The process of claim 1, further comprising the step of:

drawing said photoresist and polymer residues away from said post-metal etch wafer and exhausting said photoresist and polymer residues from said process chamber with a vacuum pump.

8. A process for removing photoresist and polymer residues from a post-metal etch wafer in a process chamber, comprising the steps of:

initiating a flow of feed gas comprising fluorine-containing species upstream from said process chamber;

vaporizing water;

delivering said vaporized water into said feed gas at a controlled flow rate that is low enough to avoid saturation of said feed gas thereby;

applying to said feed gas a means for producing a plasma, such that a reactive species is generated thereby;

supplying effluents of said plasma and separated from said plasma to said process chamber;

applying radio frequency energy to a wafer chuck in said process chamber to generate a lower intensity plasma with said reactive species and accompanying wafer self-biasing;

applying a magnetic field that rotates slowly in the horizontal plane to said process chamber;

stripping said photoresist and polymer residues from said post metal-etch wafer with said reactive species and lower intensity plasma;

drawing said photoresist and polymer residues away from said process chamber with a vacuum pump; and forming a passivation layer on said post-metal etch wafer wherein the pressure in said process chamber is greater than 100 miliTorr.

9. The process of claim 8, wherein said radio frequency energy is generated at a frequency of 13.56 MHz.

10. The process of claim 8, wherein said radio frequency energy is modulated.

11. The process of claim 1, wherein said photoresist and polymer residues are isotropically stripped from said up top surface and side walls of said post metal-etch wafer.

12. The process of claim 8, wherein said photoresist and polymer residues are isotopically stripped from said up top surface and side walls of said post metal-etch wafer.

\* \* \* \* \*